(12) United States Patent  
Bangsaruntip et al.

(10) Patent No.: US 8,680,589 B2
(45) Date of Patent: Mar. 25, 2014

(54) OMEGA SHAPED NANOWIRE FIELD EFFECT TRANSISTORS

(75) Inventors: Sarunya Bangsaruntip, Mount Kisco, NY (US); Josephine B. Chang, Mahopac, NY (US); Guy M. Cohen, Mohegan Lake, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/372,719

(22) Filed: Feb. 14, 2012

(65) Prior Publication Data
US 2012/0146000 A1    Jun. 14, 2012

Related U.S. Application Data

(62) Division of application No. 12/631,205, filed on Dec. 4, 2009, now Pat. No. 8,129,247.

(51) Int. Cl.
*H01L 21/02* (2006.01)

(52) U.S. Cl.
USPC ........... 257/282; 257/200; 257/103; 257/283; 438/44; 438/159; 438/300; 438/301; 438/481

(58) Field of Classification Search
USPC ............... 257/103, E51.04, 200, 282–283, 257/E33.005, E21.133, E23.022, 257/E29.067–E29.27, E21.43, E21.619; 977/742, 934; 438/44–47, 159, 438/300–301, 341, 481, 174, 177, 211, 217
See application file for complete search history.

(56) References Cited

U.S. PATENT DOCUMENTS

| | | | |
|---|---|---|---|
| 4,995,001 A | 2/1991 | Dawson et al. |
| 5,308,445 A | 5/1994 | Takasu |
| 5,438,018 A | 8/1995 | Mori et al. |
| 5,552,622 A | 9/1996 | Kimura |
| 5,574,308 A | 11/1996 | Mori et al. |

(Continued)

FOREIGN PATENT DOCUMENTS

| | | |
|---|---|---|
| EP | 217811 A1 | 4/2010 |
| KR | 20090044799 A | 5/2009 |
| WO | WO02084757 A1 | 10/2002 |
| WO | WO2008069765 A1 | 6/2008 |

OTHER PUBLICATIONS

Alexander J. Gates, "Designing a Nanoelectronic Circuit to Control a Millimeter-scale Walking Robot," Mitre Technical Paper, Nov. 2004, http://www.mitre.org/work/tech_papers/tech_papers_04/04_1248/04_1248.pdf.

(Continued)

*Primary Examiner* — Steven Loke
*Assistant Examiner* — Cuong B Nguyen
(74) *Attorney, Agent, or Firm* — Cantor Colburn LLP; Vazken Alexanian

(57) ABSTRACT

A method for forming a nanowire field effect transistor (FET) device includes forming a nanowire on a semiconductor substrate, forming a first gate structure on a first portion of the nanowire, forming a first protective spacer adjacent to sidewalls of the first gate structure and over portions of the nanowire extending from the first gate structure, removing exposed portions of the nanowire left unprotected by the first spacer, and epitaxially growing a doped semiconductor material on exposed cross sections of the nanowire to form a first source region and a first drain region.

18 Claims, 14 Drawing Sheets

(56) References Cited

U.S. PATENT DOCUMENTS

| | | | |
|---|---|---|---|
| 5,668,046 A | 9/1997 | Koh et al. |
| 6,365,465 B1 | 4/2002 | Chan et al. |
| 6,642,115 B1 | 11/2003 | Cohen et al. |
| 6,653,209 B1 | 11/2003 | Yamagata |
| 6,806,141 B2 | 10/2004 | Kamins |
| 6,835,618 B1* | 12/2004 | Dakshina-Murthy et al. ............... 438/256 |
| 6,855,606 B2 | 2/2005 | Chen et al. |
| 6,882,051 B2 | 4/2005 | Majumdar et al. |
| 6,891,227 B2 | 5/2005 | Appenzeller et al. |
| 6,903,013 B2 | 6/2005 | Chan et al. |
| 6,996,147 B2 | 2/2006 | Majumdar et al. |
| 7,101,762 B2 | 9/2006 | Cohen et al. |
| 7,151,209 B2 | 12/2006 | Empedocles et al. |
| 7,180,107 B2 | 2/2007 | Appenzeller et al. |
| 7,211,853 B2 | 5/2007 | Bachtold et al. |
| 7,253,060 B2 | 8/2007 | Yun et al. |
| 7,297,615 B2 | 11/2007 | Cho et al. |
| 7,311,776 B2 | 12/2007 | Lin et al. |
| 7,443,025 B2 | 10/2008 | Verbist |
| 7,446,025 B2 | 11/2008 | Cohen et al. |
| 7,449,373 B2 | 11/2008 | Doyle et al. |
| 7,452,759 B2 | 11/2008 | Sandhu |
| 7,452,778 B2 | 11/2008 | Chen et al. |
| 7,456,068 B2 | 11/2008 | Kavalieros et al. |
| 7,456,476 B2 | 11/2008 | Hareland et al. |
| 7,473,943 B2 | 1/2009 | Mostarshed et al. |
| 7,498,211 B2 | 3/2009 | Ban et al. |
| 7,534,675 B2 | 5/2009 | Bangsaruntip et al. |
| 7,550,333 B2 | 6/2009 | Shah et al. |
| 7,569,941 B2 | 8/2009 | Majumdar et al. |
| 7,642,578 B2 | 1/2010 | Lee et al. |
| 7,791,144 B2 | 9/2010 | Chidambarrao et al. |
| 7,795,677 B2 | 9/2010 | Bangsaruntip et al. |
| 7,799,657 B2 | 9/2010 | Dao |
| 7,803,675 B2 | 9/2010 | Suk et al. |
| 7,834,345 B2 | 11/2010 | Bhuwalka et al. |
| 7,871,870 B2 | 1/2011 | Mostarshed et al. |
| 7,893,506 B2 | 2/2011 | Chau et al. |
| 8,064,249 B2 | 11/2011 | Jang et al. |
| 8,097,515 B2 | 1/2012 | Bangsaruntip et al. |
| 8,154,127 B1 | 4/2012 | Kamins et al. |
| 8,338,280 B2 | 12/2012 | Tan et al. |
| 8,541,774 B2 | 9/2013 | Bangsaruntip et al. |
| 2004/0149978 A1 | 8/2004 | Snider |
| 2004/0166642 A1 | 8/2004 | Chen et al. |
| 2005/0121706 A1* | 6/2005 | Chen et al. ............... 257/288 |
| 2005/0266645 A1 | 12/2005 | Park |
| 2005/0275010 A1 | 12/2005 | Chen et al. |
| 2006/0033145 A1 | 2/2006 | Kakoschke et al. |
| 2006/0131665 A1* | 6/2006 | Murthy et al. ............... 257/384 |
| 2006/0138552 A1* | 6/2006 | Brask et al. ............... 257/369 |
| 2006/0197164 A1 | 9/2006 | Lindert et al. |
| 2007/0001219 A1 | 1/2007 | Radosavljevic et al. |
| 2007/0267619 A1 | 11/2007 | Nirschl |
| 2007/0267703 A1 | 11/2007 | Chong et al. |
| 2007/0284613 A1 | 12/2007 | Chui et al. |
| 2008/0014689 A1 | 1/2008 | Cleavelin et al. |
| 2008/0061284 A1 | 3/2008 | Chu et al. |
| 2008/0067495 A1 | 3/2008 | Verhulst |
| 2008/0067607 A1 | 3/2008 | Verhulst et al. |
| 2008/0079041 A1 | 4/2008 | Suk et al. |
| 2008/0085587 A1 | 4/2008 | Wells et al. |
| 2008/0121932 A1 | 5/2008 | Ranade |
| 2008/0128760 A1 | 6/2008 | Jun et al. |
| 2008/0135949 A1 | 6/2008 | Lo et al. |
| 2008/0142853 A1 | 6/2008 | Orlowski |
| 2008/0149914 A1 | 6/2008 | Samuelson et al. |
| 2008/0149997 A1 | 6/2008 | Jin et al. |
| 2008/0150025 A1 | 6/2008 | Jain |
| 2008/0179752 A1 | 7/2008 | Yamauchi et al. |
| 2008/0191196 A1 | 8/2008 | Lu et al. |
| 2008/0224224 A1 | 9/2008 | Vandenderghe et al. |
| 2008/0227259 A1 | 9/2008 | Avouris et al. |
| 2008/0246021 A1 | 10/2008 | Suk et al. |
| 2008/0247226 A1 | 10/2008 | Liu et al. |
| 2009/0026553 A1 | 1/2009 | Bhuwalka et al. |
| 2009/0057650 A1 | 3/2009 | Lieber et al. |
| 2009/0057762 A1 | 3/2009 | Bangsaruntip et al. |
| 2009/0061568 A1 | 3/2009 | Bangsaruntip et al. |
| 2009/0090934 A1 | 4/2009 | Tezuka et al. |
| 2009/0134467 A1 | 5/2009 | Ishida et al. |
| 2009/0149012 A1 | 6/2009 | Brask et al. |
| 2009/0181477 A1 | 7/2009 | King et al. |
| 2009/0217216 A1 | 8/2009 | Lee et al. |
| 2009/0290418 A1 | 11/2009 | Han |
| 2009/0294864 A1 | 12/2009 | Suk et al. |
| 2010/0140589 A1 | 6/2010 | Ionescu |
| 2010/0193770 A1 | 8/2010 | Bangsaruntip et al. |
| 2010/0207102 A1 | 8/2010 | Lee et al. |
| 2011/0133169 A1 | 6/2011 | Bangsaruntip et al. |
| 2011/0147840 A1 | 6/2011 | Cea et al. |
| 2012/0146000 A1 | 6/2012 | Bangsaruntip et al. |
| 2013/0001517 A1 | 1/2013 | Bangsaruntip et al. |

OTHER PUBLICATIONS

Andriotis et al., 'Realistic nanotube-metal contact configuration for molecular electronics applications, IEEE Sensors Journal, vol. 8, No. 6, Jun. 2008.

R, Bahar, 'Trends and Future Directions in Nano Structure Based Computing and Fabrication', ICCD 2006, International Conf. on Computer Design, Oct. 1-4, 2007, pp. 522-527.

Buddharaju et al., 'Gate-All-Around Si-Nanowire CMOS Inverter Logic Fabricated Using Top-Down Approach', European Solid-State Device Research Conference, Sep. 11-11, 2007, pp. 303-306.

Chen et al., 'Demonstration of Tunneling FETs Based on Highly Scalable Verticle Silicon Nanowires', IEEE Electron Device Letters, vol. 30, No. 7, Jul. 2009, pp. 754-756.

Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.

G.W. Neudeck, "An Overview of Double-Gate MOSFETs," Proceedings of 15th Biennial University/Government/Industry Microelectronics Symposium. UGIM 2003. New York, NY: IEEE, US, Jun. 30-Jul. 2, 2003, Jun. 30, 2003, pp. 214-217.

Hu et al., 'Fringing field effects on electrical resistivity of semiconductor nanowire-metal contacts', Applied Physics Letters 92, 083503_2008.

International Search Report; International Application No. PCT/US2011/029304; International Filing Date: Mar. 22, 2011; Date of Mailing: May 20, 2011.

Jie Xiang et al., "Ge/Si Nanowire Heterostructures as High-Performance Field-Effect Transistors," Nature 441, 489-493 (May 25, 2006).

Knoch et al., 'Tunneling phenomena in carbon nanotube field-effect transistors', Phys Stat Sol. (a) 205, No. 4, 679-694 (2008).

Lauhon et al., 'Epitaxial core-shell and core-multishell nanowire heterostructures', Nature, vol. 420, Nov. 7, 2002, pp. 57-61.

Leonard et al., 'Size-dependent effects on electrical contacts to nanotubes and nanowires', Phys Rev Lett., Jul. 14, 2006; 97(2):026804.

M. M. Ziegler et al., "The CMOS/NANO Interface from a Circuits Perspective," ISCAS '03. Proceedings of the 2003 International Symposium on Circuits and Systems, 2003, May 25-28, 2003, vol. 4, pp. IV-904-IV-907.

M. T. Bjork et al., "Silicon Nanowire Tunneling Field-Effect Transistors," Applied Physics Letters 92, 193504 (2008).

Ma et al., 'High-performance nanowire complementary metal-semiconductor inverters', Applied Physics Letters 93, 053105_2008.

Saumitra Raj Mehrotra, 'A Simulation Study of Silicom Nanowire Field Effect Transistors (FETs), University of Cincinnati, Jul. 2007.

N. Checka, 'Circuit Architecture for 3D Integration', Chapter 13 in Wafer Level 3-D ICs Process Technology, ed. C.S. Tan, Springer US, 2008, ISBN 978-0-387-76534-1.

International Search Report; International Application No. PCT/EP2010/066961; International Filing Date: Nov. 8, 2010; Date of Mailing: Feb. 10, 2011.

(56) References Cited

OTHER PUBLICATIONS

International Search Report; International Application No. PCT/EP2010/066483; International Filing Date: Oct. 29, 2010; Date of Mailing: Feb. 7, 2011.
International Search Report—Written Opinion; International Application No. PCT/EP2010/066483; International Filing Date: Oct. 29, 2010; Date of Mailing: Feb. 7, 2011.
International Search Report—Written Opinion; International Application No. PCT/EP2010/066961; International Filing Date: Nov. 8, 2010; Date of Mailing: Feb. 10, 2011.
Pavanello et al., "Evaluation of Triple-Gate FinFETs With SiO2—HfO2—TiN Gate Stack Under Analog Operation," Solid State Electronics, Elsevier Science Publishers, Barking, GB, vol. 51, No. 2, Mar. 7, 2007, pp. 285-291.
Singh et al., 'High-Performance Fully Depleted Silicon Nanowire (Diameter = 5 nm) Gatw-All-Around CMOS Devices', IEEE Electron Device Letters, vol. 27, No. 5, May 2006, pp. 383-386.
Taichi Su et al., "New Planar Self-Aligned Double-Gate Fully Depleted P-MOSFET's Using Epitaxial Lateral Overgrowth (ELO) and Selectively Grown Source/Drain (S/D)," 2000 IEEE International SOI Conference, Oct. 2000, pp. 110-111.
International Search Report—Written Opinion; International Application No. PCT/US2011/029304; International Filing Date: Mar. 22, 2011; Date of Mailing; May 20, 2011.
Checka, N., 'Circuit Architecture for 3D Integration', Chapter 13 in Wafer Level 3-D ICs Process Technology, ed. C.S. Tan, Springer US, 2008, ISBN 978-0-387-76534-1.
Chen et al., "An Integrated Logic Circuit Assembled ona Single Carbon Nanotube", www.sciencemag.org Science, vol. 311, Mar. 24, 2006, p. 1735.
Derycke, et al, "Carbon Nanotube Inter- and Intramolecular Logic Gates" Nano Letters, Sep. 2001, vol. 1, No. 9, pp. 453-456.
International Search Report; International Application No. PCT/US11/49501; International Filing Date: Aug. 29, 2011; Date of Mailing: Jan. 18, 2012.
International Search Report Written Opinion; International Application No. PCT/US11/49501; International Filing Date: Aug. 29, 2011; Date of Mailing: Jan. 18, 2012.
Office Action—Non-Final for U.S. Appl. No. 12/684,280, filed Jan. 8, 2010; First Named Inventor: Sarunya Bangsaruntip; Mailing Date: May 2, 2011.
Office Action—Non-Final for U.S. Appl. No. 12/778,315, filed May 12, 2010; First Named Inventor: Sarunya Bangsaruntip; Mailing Date: Mar. 26, 2012.
Office Action—Non-Final for U.S. Appl. No. 12/856,718, filed Aug. 16, 2010; first Named Inventor Sarunya Bangsaruntip; Mailing Date: Jul. 9, 2012.
Office Action—Restriction Election for U.S. Appl. No. 12/684,280, filed Jan. 8, 2010; First Named Inventor: Sarunya Bangsaruntip; Mailing Date: Feb. 10, 2011.
Office Action—Restriction Election for U.S. Appl. No. 12/776,485, filed May 10, 2010; First Named Inventor: Sarunya Bangsaruntip; Mailing Date: Dec. 9, 2011.
Office Action—Final for U.S. Appl. No. 12/684,280, filed Jan. 8, 2010; First Named Inventor: Sarunya Bangsaruntip; Mailing Date: Oct. 5, 2011.
Restriction/Election Office Action for U.S. Appl. No. 12/758,939, filed Apr. 13, 2010; First Named Inventor: Sarunya Bangsaruntip; Mailing Date: Jun. 8, 2012.

Transmittal and International Preliminary Report on Patentability for International Application No. PCT/US2011/029304; International Filing Date: Mar. 22, 2011; date of mailing Oct. 26, 2012, 2 pages.
Office Action—Non-Final for U.S. Appl. No. 12/856,718, filed Aug. 16, 2010; First Named Inventor: Sarunya Bangsaruntip; Mailing Date: Jul. 9, 2012.
International Search Report; International Application No. PCT/EP2011/053174; International Filing Date: Mar. 3, 2011; Date of Mailing: May 31, 2011.
International Search Report—Written Opinion; International Application No. PCT/EP2011/053174; International Filing Date: Mar. 3, 2011; Date of Mailing: May 31, 2011.
Office Action—Final for U.S. Appl. No. 12/856,718, filed Aug. 16, 2010; First Named Inventor: Sarunya Bangsaruntip; Mailing Date: Dec. 13, 2012.
Office Action—Non-Final for U.S. Appl. No. 13/550,700, filed Jul. 17, 2012; First Named Inventor: Sarunya Bangsaruntip; Mailing Date: Apr. 25, 2013, 27 pgs.
Office Action—Non-Final for U.S. Appl. No. 13/556,300, filed Jul. 24, 2012; First Named Inventor: Sarunya Bangsaruntip; Mailing Date: Dec. 10, 2012.
Office Action—Non-Final for U.S. Appl. No. 13/600,585, filed Aug. 31, 2012; First Named Inventor: Sarunya Bangsaruntip; Mailing Date: Dec. 13, 2012.
Office Action—Non-Final for U.S. Appl. No. 13/551,995, filed Jul. 18, 2012; First Named Inventor: Sarunya Bangsaruntip; Mailing Date: Dec. 19, 2012.
Office Action—Non-Final for U.S. Appl. No. 12/776,485, filed May 10, 2010; First Named Inventor: Sarunya Bangsaruntip; Mailing Date: Feb. 21, 2012.
Office Action—Non-Final for U.S. Appl. No. 13/372,714, filed Feb. 14, 2012; First Named Inventor: Sarunya Bangsaruntip et al; Mailing Date: Sep. 20, 2012.
Office Action—Non-Final for U.S. Appl. No. 13/372,719, filed Feb. 14, 2012; First Named Inventor: Sarunya Bangsaruntip; Mailing Date: Sep. 4, 2012.
Office Action—Non-Final for U.S. Appl. No. 12/884,707, filed Sep. 17, 2010; First Named Inventor: Sarunya Bangsaruntip et al; Mailing Date: Oct. 2, 2012.
Written Opinion for International Application No. PCT/US2011/029304; International Filing Date: Mar. 22, 2011; mailing date: May 20, 2011; 5 pages.
Notice of Allowance for U.S. Appl. No. 12/776,485, filed May 10, 2010; First Named Inventor: Sarunya Bangsaruntip; Mailing Date: Sep. 26, 2012.
Office Action—Notice of Allowance for U.S. Appl. No. 13/551,995, filed Jul. 18, 2012; First Named Inventtor: Sarunya Bangsaruntip; Mailing Date: Jul. 15, 2013; 13 pages.
Office Action—Final for U.S. Appl. No. 13/551,995, filed Jul. 18, 2012; First Named Inventor: Sarunya Bangsaruntip; Mailing Date Apr. 30, 2013, 11 pgs.
Office Action—Non-Final for U.S. Appl. No. 13/550,700, filed Jul. 17, 2012; First Named Inventor: Sarunya Bangsaruntip; Mailing Date: Apr. 25, 2013; 27 pgs.
Office Action—Non-Final for U.S. Appl. No. 12/631,199, filed Dec. 4, 2009; First Named Inventor: Sarunya Bangsaruntip; Mailing Date: Jun. 13, 2012.
Office Action—Restriction-Election for U.S. Appl. No. 12/856,718, filed Aug. 16, 2010; First Named Inventor: Sarunya Bangsaruntip; Mailing Date: Apr. 9, 2012.

* cited by examiner

A - A

OMEGA SHAPED NANOWIRE FIELD EFFECT TRANSISTORS

CROSS REFERENCE TO RELATED APPLICATIONS

This is a divisional application of Application No. 12/631,205, filed Dec. 4, 2009.

This application is related to co-pending application Ser. No. 12/631,199, filed Dec. 4, 2009, application Ser. No. 12/630,942, filed Dec. 4, 2009, Application Ser. No. 12/630,939, filed Dec. 4, 2009, Application Ser. No. 12/631,213, filed Dec. 4, 2009, and Application Ser. No. 12/631,342, filed Dec. 4, 2009, all of which are incorporated by reference herein.

FIELD OF INVENTION

The present invention relates to semiconductor nanowire field effect transistors.

DESCRIPTION OF RELATED ART

A nanowire field effect transistor (FET) includes doped portions of nanowire that contact the channel region and serve as source and drain regions of the device. Previous fabrication methods that used ion-implantation to dope the small diameter nanowire may result in undesirable amorphization of the nanowire or an undesirable junction doping profile.

BRIEF SUMMARY

In one aspect of the present invention, a method for forming a nanowire field effect transistor (FET) device includes forming a nanowire on a semiconductor substrate, forming a first gate structure on a first portion of the nanowire, forming a first protective spacer adjacent to sidewalls of the first gate structure and over portions of the nanowire extending from the first gate structure, removing exposed portions of the nanowire left unprotected by the first spacer, and epitaxially growing a doped semiconductor material on exposed cross sections of the nanowire to form a first source region and a first drain region In another aspect of the present invention, A method for a nanowire field effect transistor (FET) device includes forming a nanowire on a semiconductor substrate, forming a gate structure on a portion of the nanowire, forming a protective spacer adjacent to sidewalls of the gate structure and over portions of the nanowire extending from the gate structure, removing exposed portions of the nanowire to form a cavity defined by the nanowire surrounded by the gate structure, the semiconductor substrate, and the spacer, and epitaxially growing a doped semiconductor material in the cavity from exposed cross sections of the nanowire.

In yet another aspect of the present invention, a nanowire field effect transistor (FET) device includes a channel region including a silicon portion disposed on a semiconductor substrate having a first distal end extending from the channel region and a second distal end extending from the channel region, the silicon portion is partially surrounded by a gate structure disposed circumferentially on the silicon portion, a source region including a first doped epi-silicon nanowire extension contacting the first distal end of the silicon portion, and a drain region including a second doped epi-silicon nanowire extension contacting the second distal end of the silicon portion.

In yet another aspect of the present invention, a nanowire field effect transistor (FET) device includes a channel region disposed on a semiconductor substrate including a silicon portion having a first distal end and a second distal end, the silicon portion is surrounded by a gate structure disposed circumferentially on the silicon portion, a first cavity defined by the first distal end of the silicon portion, the semiconductor substrate, and an inner diameter of the gate structure, a second cavity defined by the second distal end of the silicon portion, the semiconductor substrate, and an inner diameter of the gate structure, a source region including a first doped epi-silicon nanowire extension epitaxially extending from the first distal end of the silicon portion in the first cavity, and a drain region including a second doped epi-silicon nanowire extension epitaxially extending from the second distal end of the silicon portion in the second cavity.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
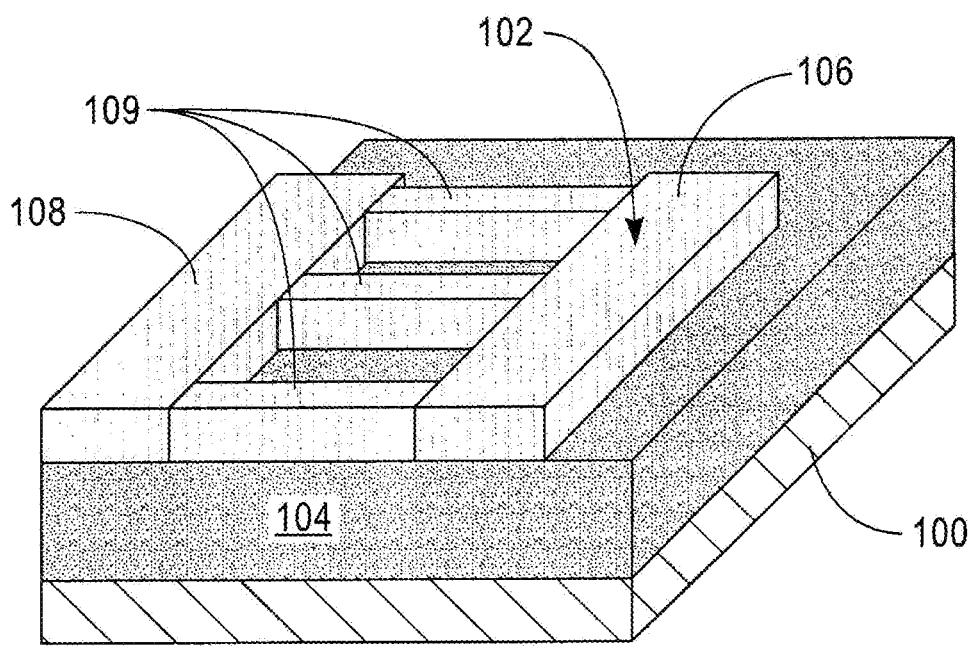
FIGS. 1-12B illustrate an exemplary method for forming field effect transistor (FET) devices.

With reference now to FIG. 1, a silicon on insulator (SOI) portion 102 is defined on a buried oxide (BOX) layer 104 that is disposed on a silicon substrate 100. The SOI portion 102 includes a SOI pad region 106, a SOI pad region 108, and nanowire portions 109. The SOI portion 102 may be patterned by the use of lithography followed by an etching process such as, for example, reactive ion etching (RIE).

Figure 2:
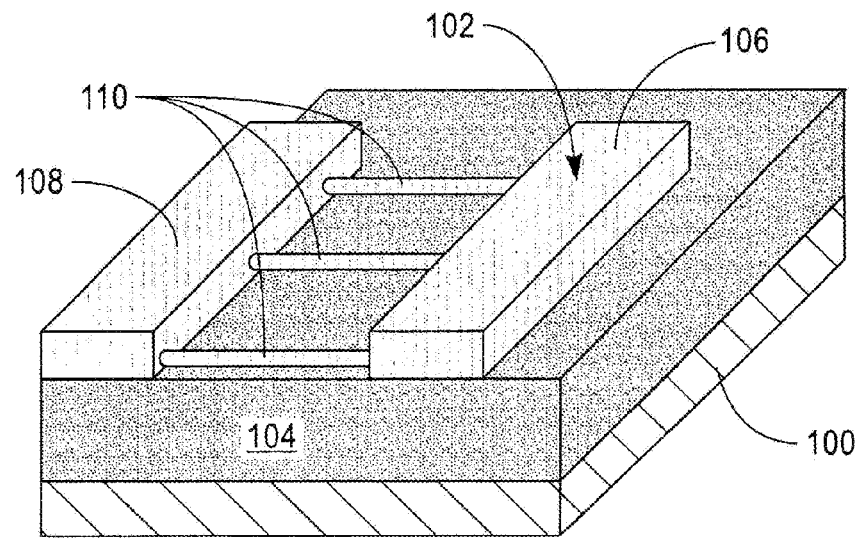

FIG. 2 illustrates the nanowires 110 disposed on the BOX layer 104 following an oxidation process that reduces the diameter of the nanowires 110. The reduction of the diameter of the nanowires 110 may be performed by, for example, an oxidation of the nanowires 110 followed by the etching of the grown oxide. The oxidation and etching process may be repeated to achieve a desired nanowire 110 diameter. Once the diameters of the nanowires 110 have been reduced, gates are formed over the channel regions of the nanowires 110 (described below).

Figure 3A:
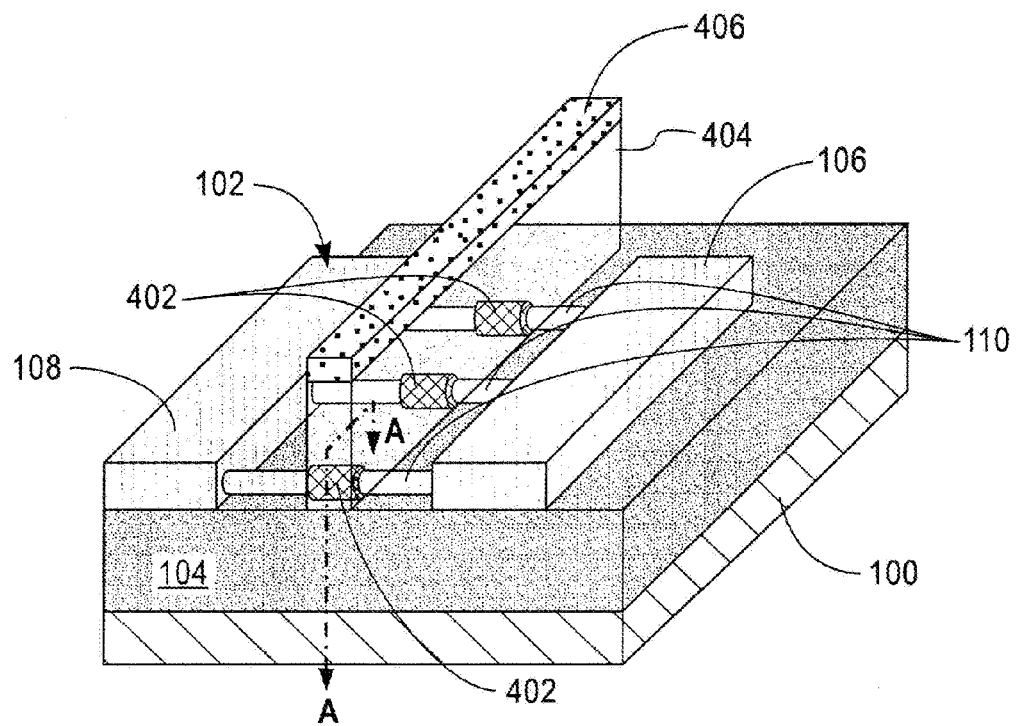

FIG. 3A illustrates gates 402 that are formed on the nanowires 110, as described in further detail below, and capped with a polysilicon layer (capping layer) 404. A hardmask layer 406, such as, for example silicon nitride ($Si_3N_4$) is deposited over the polysilicon layer 404. The polysilicon layer 404 and the hardmask layer 406 may be formed by depositing polysilicon material over the BOX layer 104 and the SOI portion 102, depositing the hardmask material over the polysilicon material, and etching by RIE to form the polysilicon layer 406 and the hardmask layer 404 illustrated in FIG. 3A. The etching of the gate 402 may be performed by directional etching that results in straight sidewalls of the gate 402.

Figure 3B:
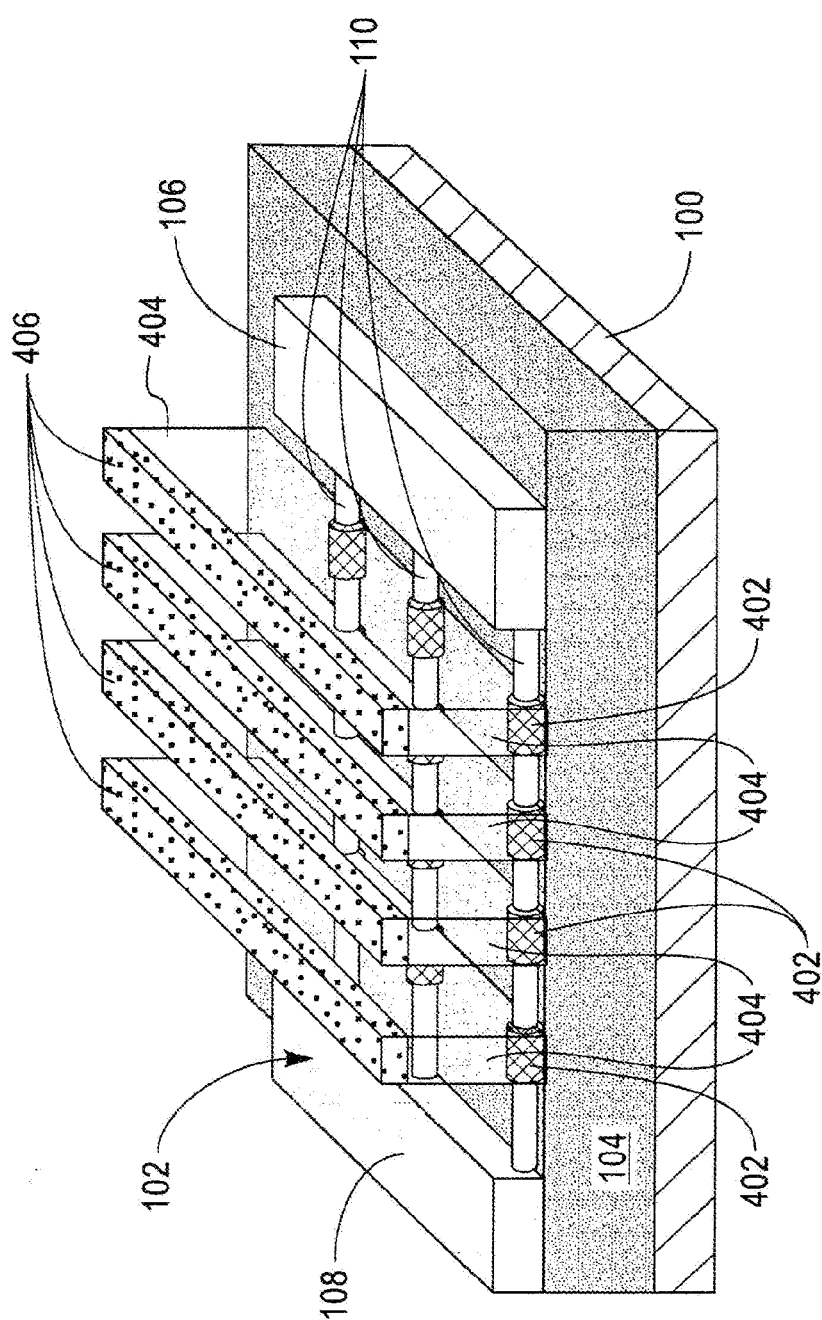

FIG. 3B illustrates a perspective view of an exemplary alternate arrangement that includes a plurality of gates 402 that are formed on the nanowires 110 between SOI pad regions 106 and 108. The fabrication of the arrangement shown in FIG. 3B may be performed using similar methods as described above for the fabrication of a single row of gates 402 line, and illustrates how the methods described herein may be used to form any number of devices on a nanowire between SOI pad regions 106 and 108.

Figure 4:
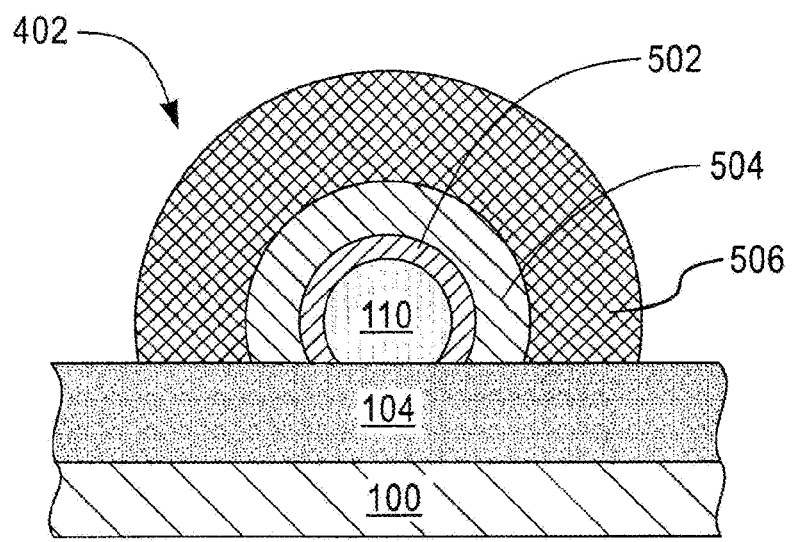

FIG. 4 illustrates a cross sectional view of a gate 402 along the line A-A (of FIG. 3A). The gate 402 is formed by depositing a first gate dielectric layer 502, such as silicon dioxide ($SiO_2$) on a channel portion of the nanowire 110. A second gate dielectric layer 504 such as, for example, hafnium oxide ($HfO_2$) is formed on the first gate dielectric layer 502. A metal layer 506 such as, for example, tantalum nitride (TaN) is formed on the second gate dielectric layer 504. The metal layer 506 is surrounded by polysilicon layer 404 (of FIG. 3A). Doping the polysilicon layer 404 with impurities such as boron (p-type), or phosphorus (n-type) makes the polysilicon layer 404 conductive.

Figure 5A:
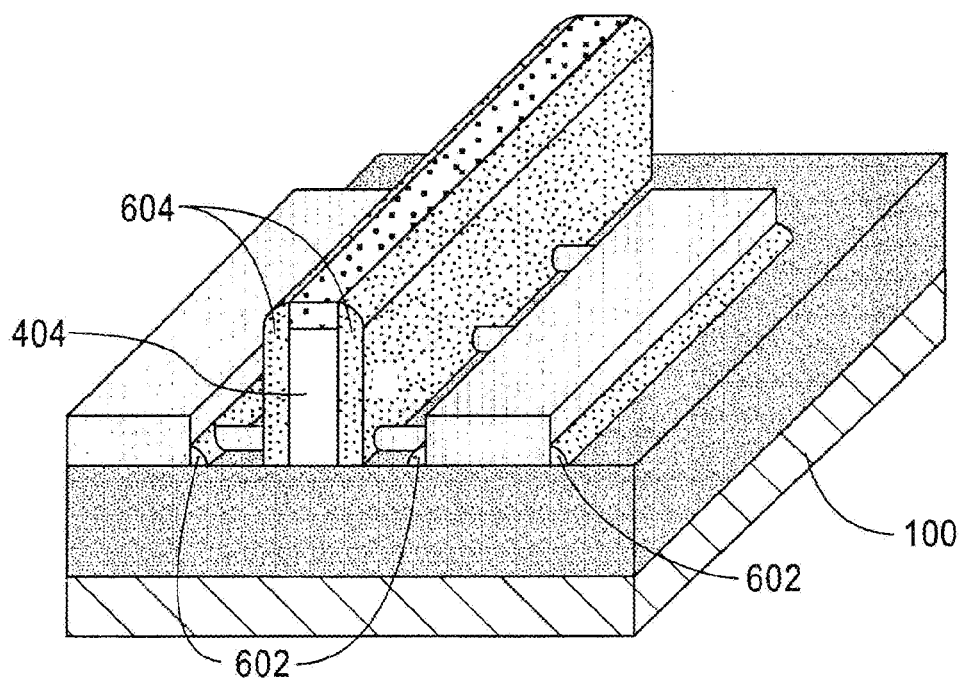
Figure 5B:
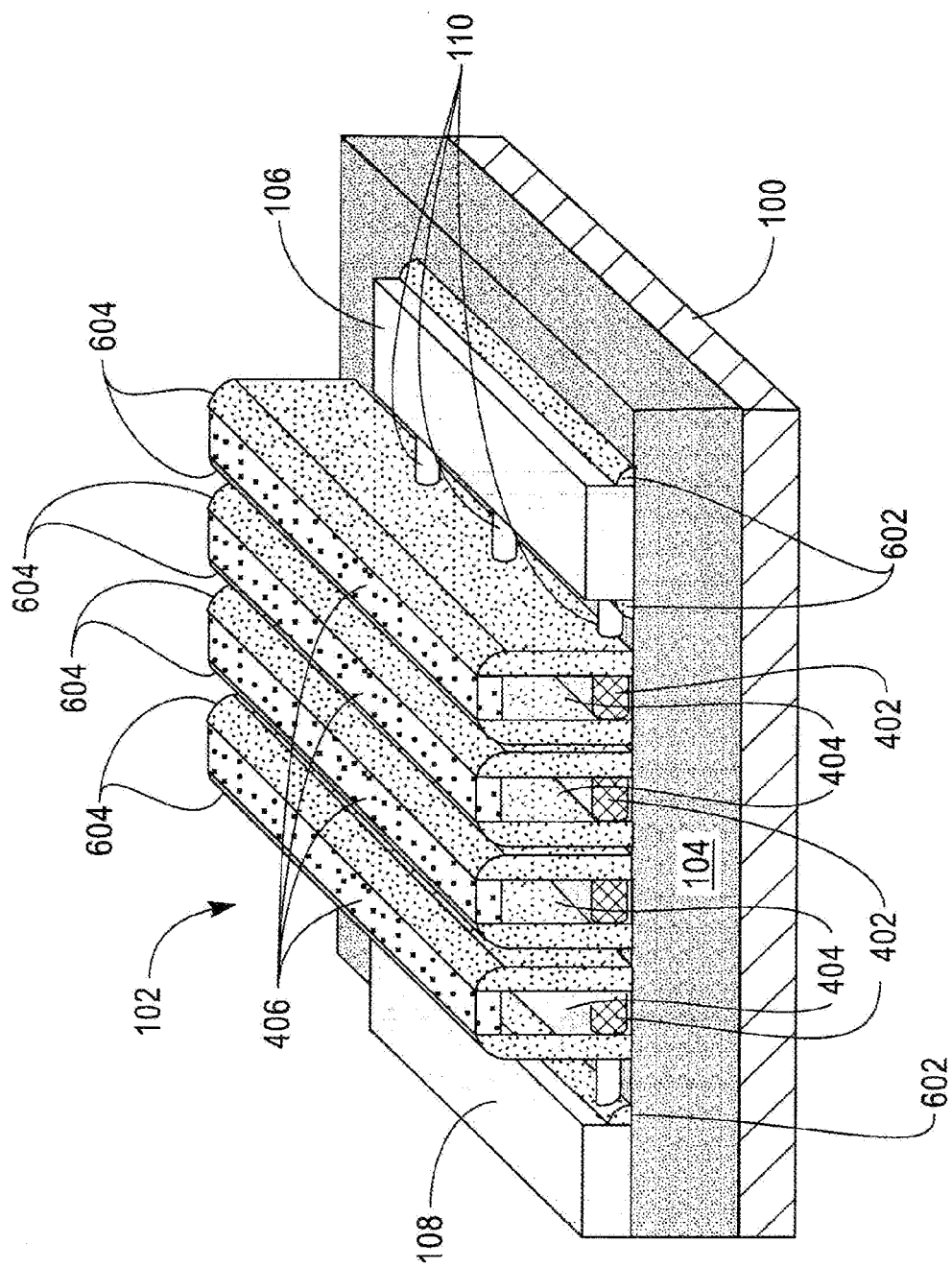

FIGS. 5A and 5B illustrate the spacer portions 604 formed along opposing sides of the polysilicon layer 404. The spacers are formed by depositing a blanket dielectric film such as silicon nitride and etching the dielectric film from all horizontal surfaces by RIE. The spacer walls 604 are formed around portions of the nanowire 110 that extend from the polysilicon layer 404 and surround portions of the nanowires 110. FIGS. 5A and 5B include spacer portions 602 that are formed under the nanowires 110, and in the undercut regions 202 (of FIG. 2).

Figure 6A:
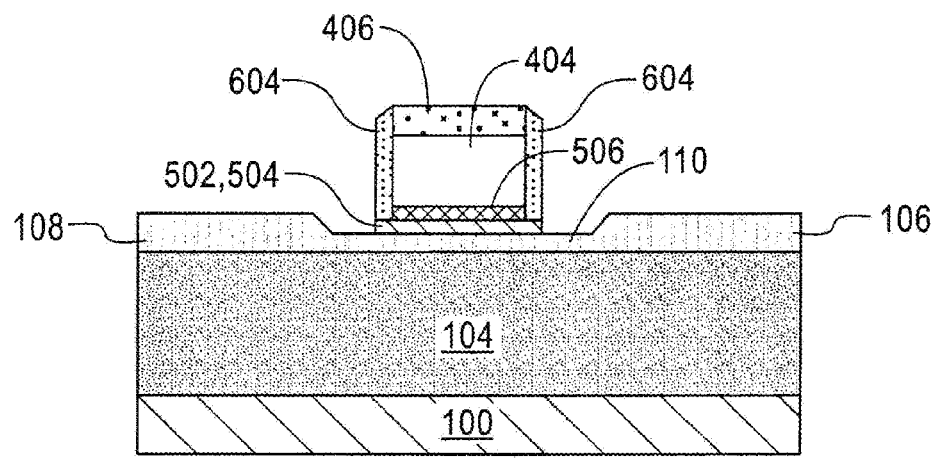
Figure 6B:
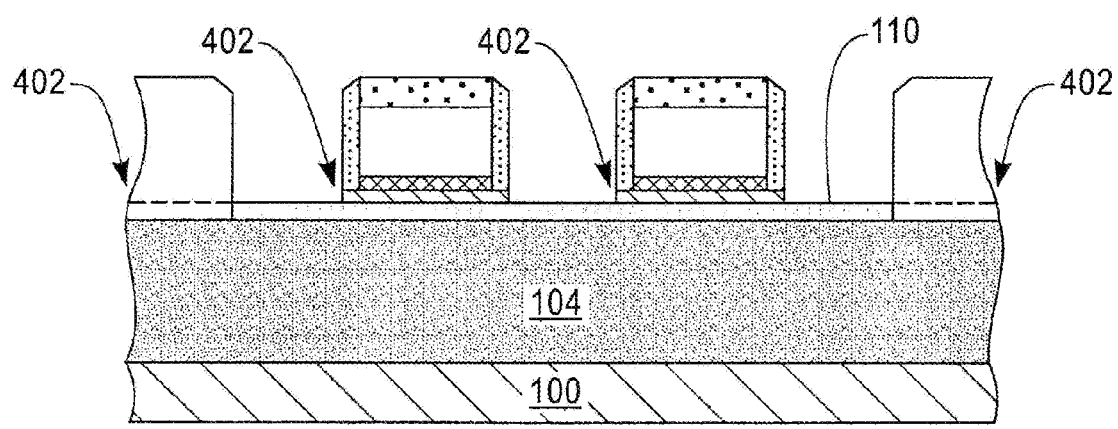

FIG. 6A illustrates a cross-sectional view (of FIG. 5A). FIG. 6B illustrates a similar cross-sectional view of the exemplary alternate arrangement of FIG. 5B.

Figure 7A:
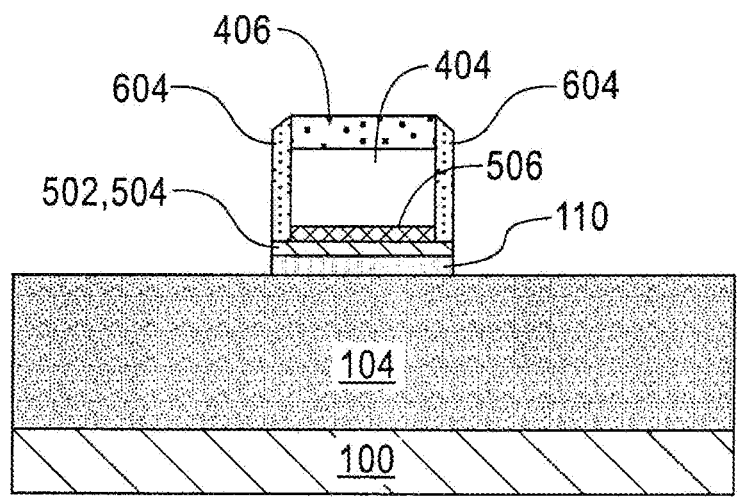
Figure 7B:
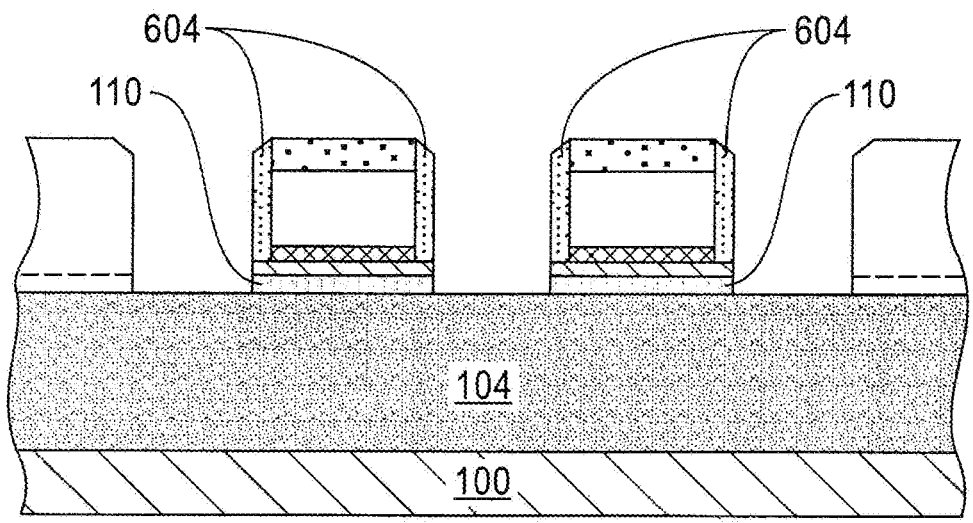

FIGS. 7A and 7B illustrate cross-sectional views of the resultant structures following a selective RIE process, that removes exposed portions of the nanowires 110 and the SOI pad regions 106 and 108 (shown in FIG. 6A). An example of a selective RIE process includes a RIE based on HBr chemistry that etches silicon while being selective to reduce the etching of dielectrics such as silicon oxide and silicon nitride. The portions of the nanowire 110 that are surrounded by the spacer walls 604 are not etched, and have exposed cross sections defined by the spacer walls 604.

Figure 8A:
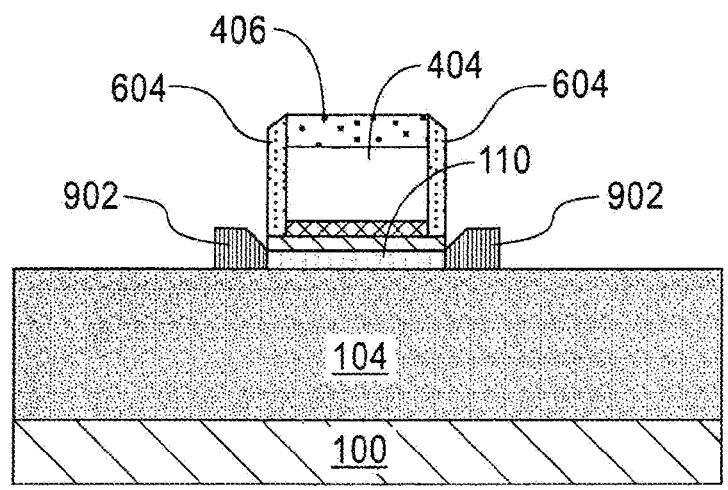
Figure 8B:
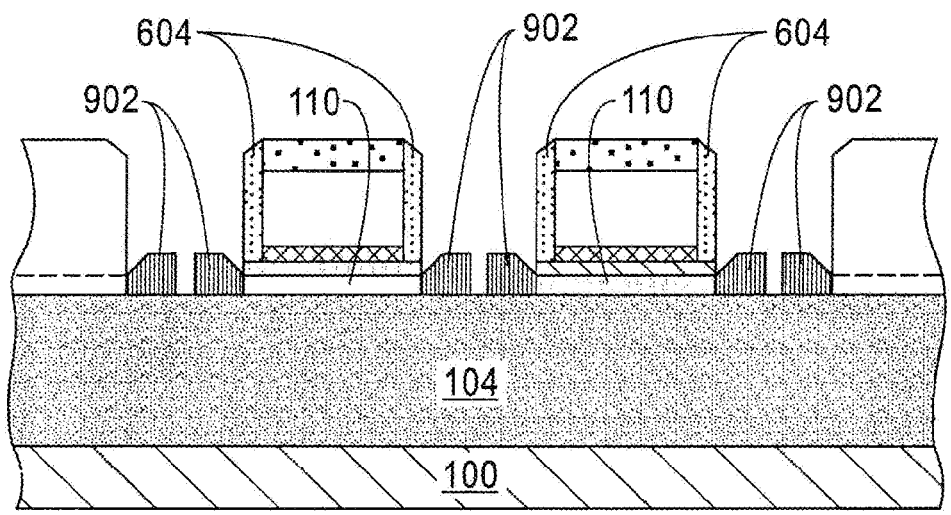

FIGS. 8A and 8B illustrate cross-sectional views of the resultant structures following a selective epi-silicon growth to form epi-nanowire extensions 902 (nanowire extensions). The nanowire extensions 902 are epitaxially grown from the exposed cross-sectional portions of the nanowire 110 that are surrounded by the spacer walls 604. The nanowire extensions 902 are formed by epitaxially growing, for example, in-situ doped silicon (Si) or a silicon germanium (SiGe) that may be either n-type or p-type doped. The in-situ doped epi process forms the source region and the drain region of the nanowire FET. As an example, a chemical vapor deposition (CVD) reactor may be used to perform the epitaxial growth. Precursors for silicon epitaxy include $SiCl_4$, $SiH_4$ combined with HCL. The use of chlorine allows selective deposition of silicon only on exposed silicon surfaces. A precursor for SiGe may be $GeH_4$, which may obtain deposition selectivity without HCL. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

Figure 9A:
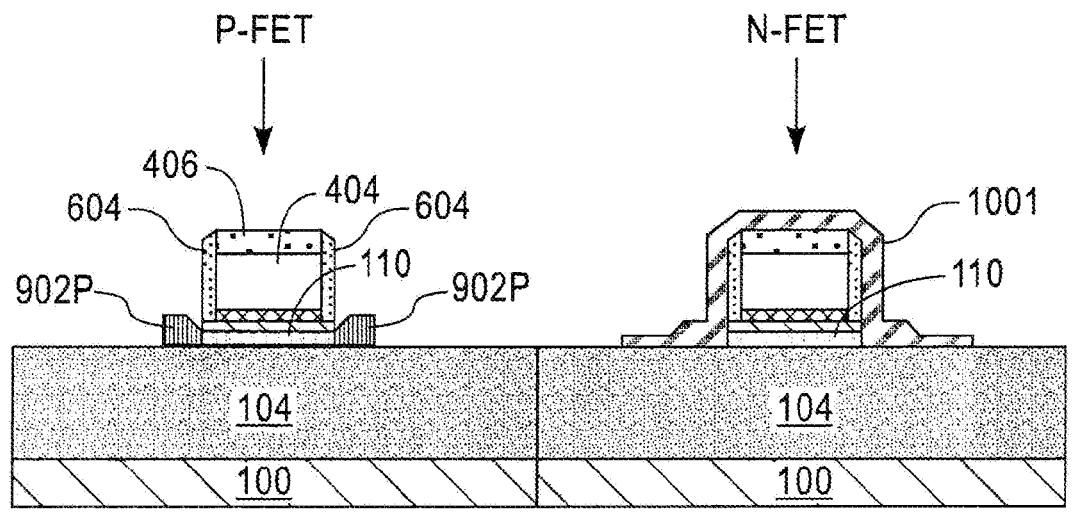
Figure 9B:
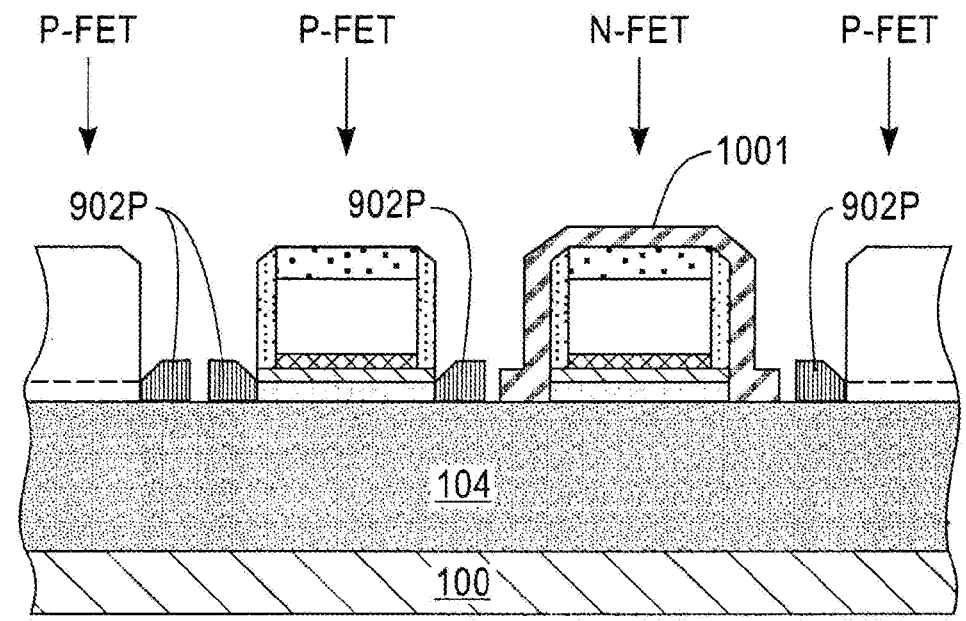

FIGS. 9A-10B illustrate an exemplary method for fabricating complementary metal-oxide-semiconductors (CMOS) having both N-FETs and P-FETs fabricated on the same chip. Since N-FETs and P-FETs have nanowire extensions with different types of dopants, the N-FET device and P-FET device nanowire extensions are grown in separately. Referring to FIG. 9A, a P-FET and N-FET device is shown. The N-FET is covered with an epi blocking mask 1001 that blocks the growth from the exposed cross-sectional portions of the nanowire 110. The epi blocking mask 1001 may be, for example, a deposited oxide film that is patterned to cover the N-FET devices. The P-FET cross-sectional portions of the nanowire 110 are exposed allowing the formation of the p+ doped nanowire extensions 902P using a selective epitaxially grown silicon deposition process similar to the process described above. FIG. 9B illustrates a similar process as described in FIG. 9A for a plurality of N-FET and P-FET devices.

Figure 10A:
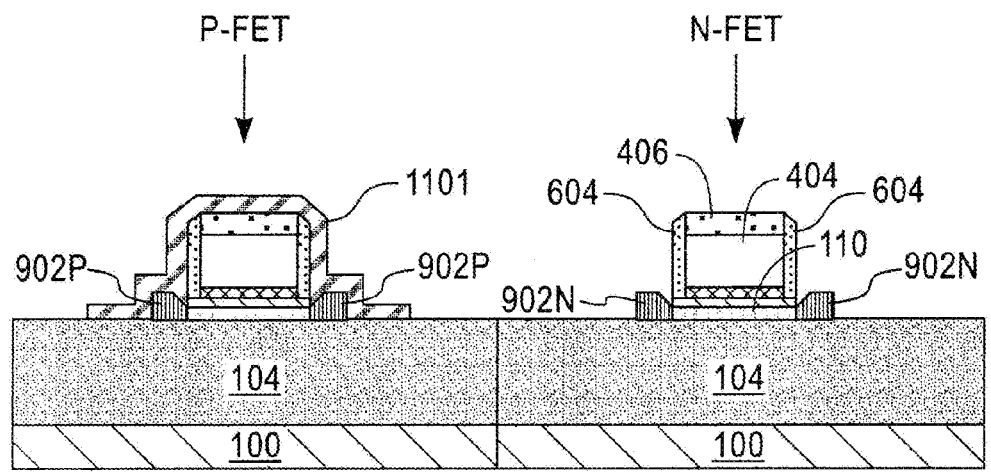
Figure 10B:
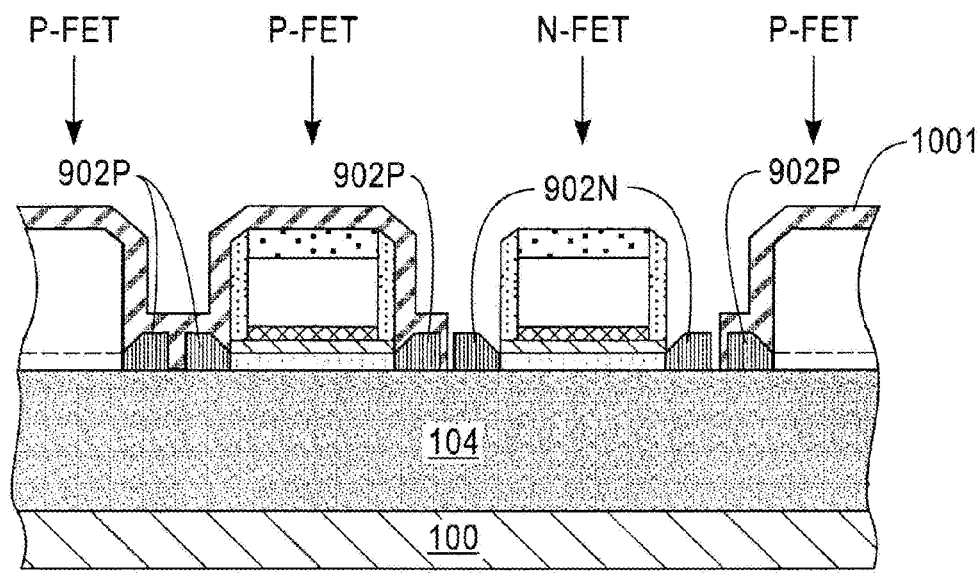

Referring to FIGS. 10A and 10B, following the growth of the p+ doped nanowire extensions 902P (in FIGS. 9A and 9B), the epi blocking masks 1001 are removed, and a second epi blocking mask 1101 is deposited and patterned to cover the P-FET and the p+ doped nanowire extensions 902P. Selective epitaxy with n-type in-situ doping is used to form the n+ doped nanowire extensions 902N. Once the n+ doped nanowire extensions 902N are formed, the second epi blocking mask 1101 may be removed. The order by which the P-FET and N-FET nanowire extensions 902 are formed may be chosen to minimize diffusion of dopants in the first grown extension during the growth of the second nanowire extension. Thus, the epitaxy of the n+ doped nanowire extensions 902N may be formed prior to forming the p+ doped nanowire extensions 902P. Since the formation of the nanowire extensions 902 may be carried out in separate processing steps, the extensions composition may be different. For example, SiGe nanowire extensions may be formed for the P-FET devices while pure silicon nanowire extensions may be formed for the N-FET devices.

Figure 11A:
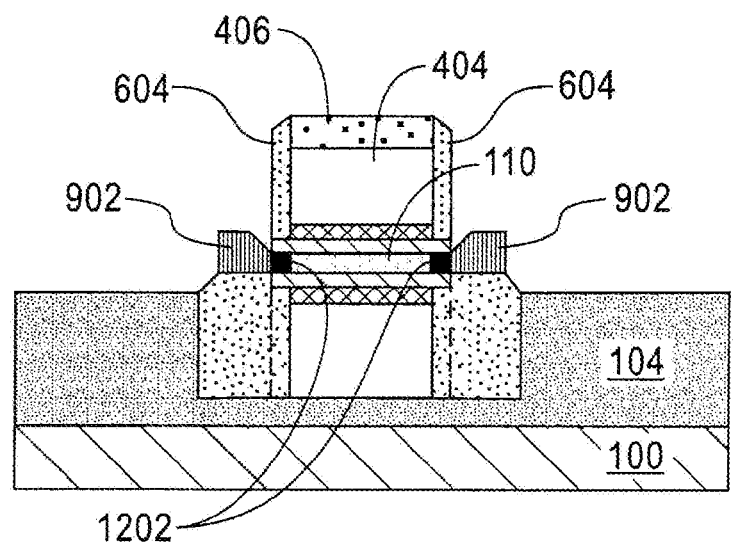
Figure 11B:
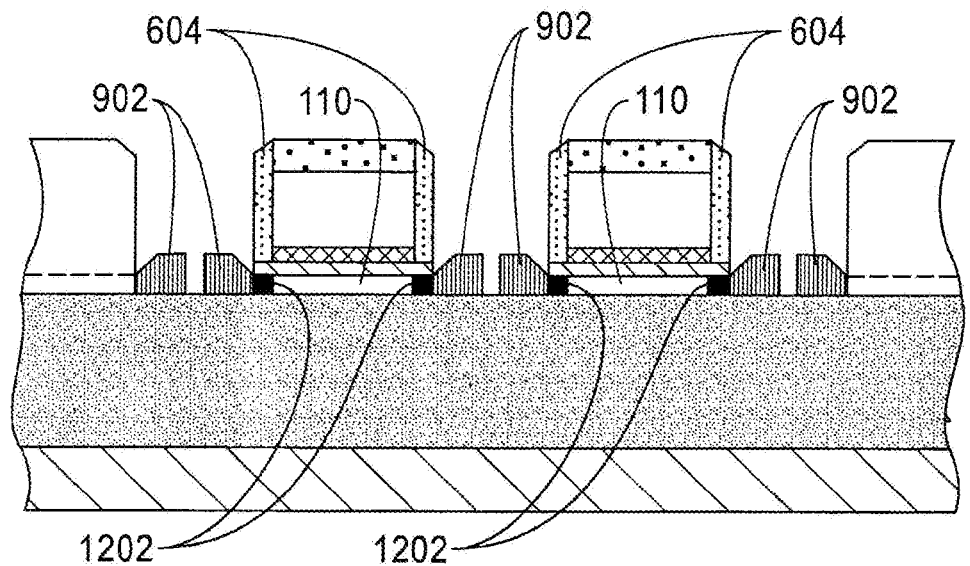

FIGS. 11A and 11B illustrate an example of the resultant structures following a thermal process (performed after the growth of the nanowire extensions 902 described above) that diffuses the doped ions from the nanowire extensions 902 into the regions 1202 of the nanowires 110 that are surrounded by the spacer walls 604 and the gates 404 to overlap the device. The nanowire extensions 902 are uniformly doped when grown; resulting in a uniform doping profile in the regions 1202 of the nanowires 110 following diffusion of the ions from the nanowire extension 902 into the regions 1202. For the CMOS devices (described above in FIGS. 9A-10B), a similar thermal process may be performed. When the n-type and p-type dopant diffusion properties are similar, similar doped regions of the nanowires 110 for both PFET and NFET devices will result. When the n-type and p-type dopant diffusion properties are dissimilar, the penetration of the n-type and p-type dopants may result in dissimilar regions 1202 in the nanowires 110. The thermal process may be performed in a rapid thermal annealing (RTA) chamber. The thermal process may be performed, for example, at annealing temperatures between 900° C. to 1100° C. for 0-10 seconds in an ambient $N_2$ gas. The annealing temperature rate may range, for example, between 50° C./second to 300° C./second.

Figure 12A:
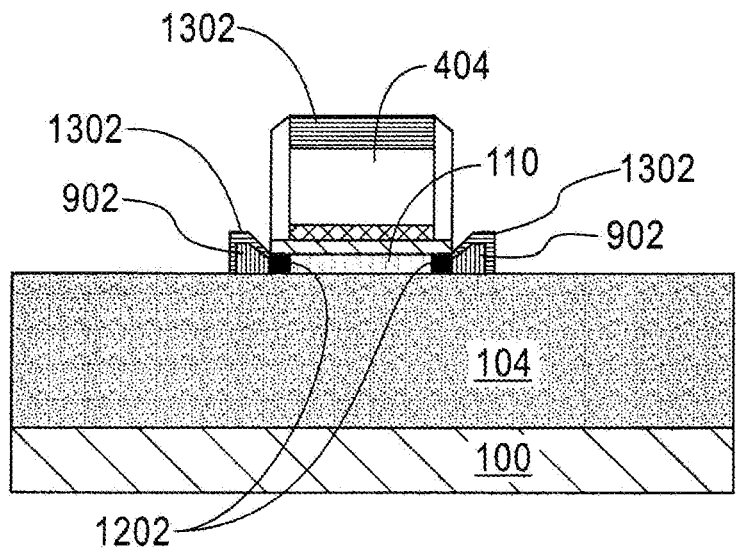
Figure 12B:
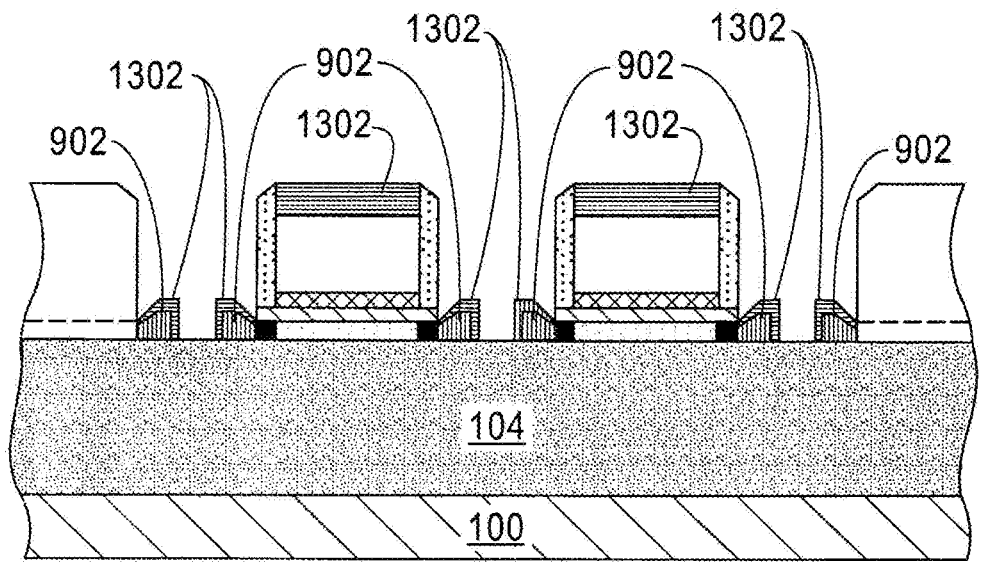

FIGS. 12A and 12B illustrate a resultant structure following silicidation where a silicide 1302 is formed on the nanowires extensions 902, and over the polysilicon layer 404. Examples of silicide forming metals include Ni, Pt, Co, and alloys such as NiPt. When Ni is used the NiSi phase is formed due to its low resistivity. For example, formation temperatures include 400-600° C. Once the silicidation process is performed, capping layers and vias for connectivity (not shown) may be formed.

Figure 13A:
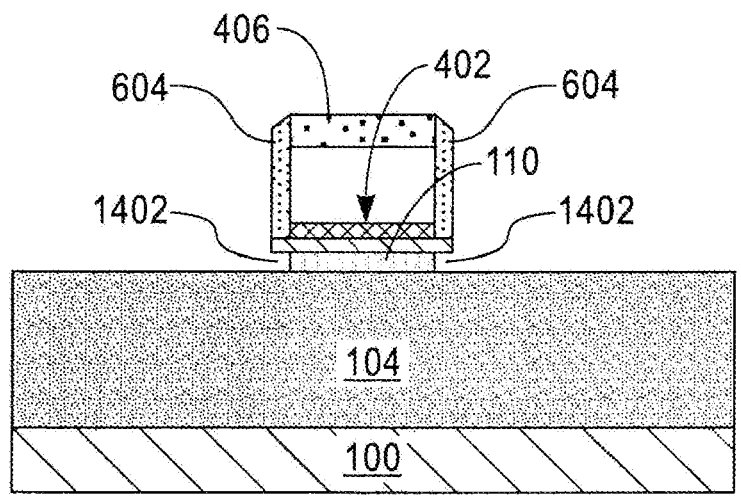
FIGS. 13A-14B illustrate an alternate exemplary method for forming field effect transistor (FET) devices.
Figure 13B:
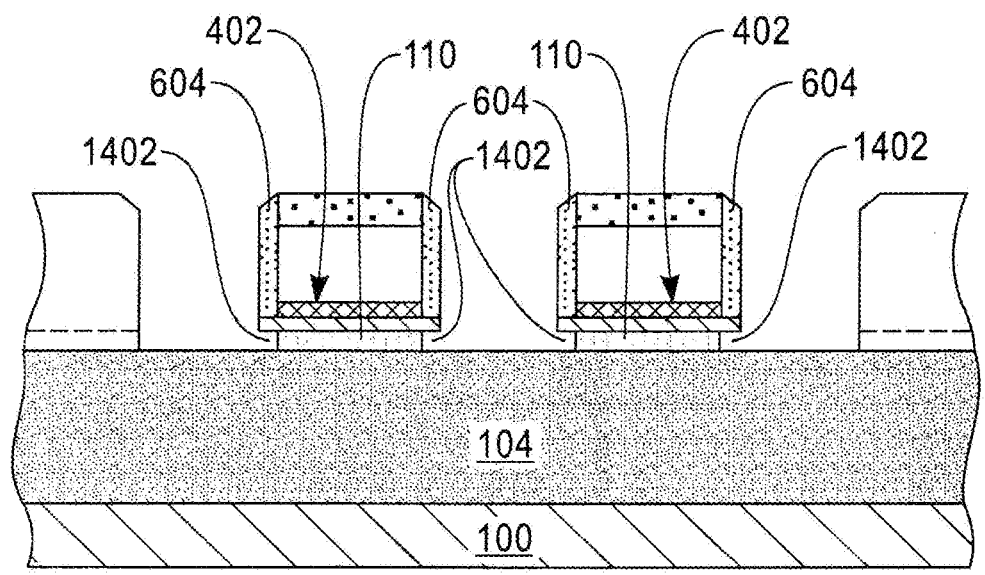

FIGS. 13A-14B illustrate an alternate exemplary method for forming a nanowire FET. The alternate exemplary method is similar to the method described above in FIGS. 1-12B. However, when the nanowires 110 are etched to remove the exposed portions of the nanowires 110, the etching process removes a portion of the nanowires 110 that are surrounded by the spacer walls 604 and the gates 402 to recess the nanowires 110 into the gates 402, and form cavities 1402 defined by the gates 402, the nanowires 110 and the spacer walls 604. FIGS. 13A and 13B illustrate a cross-sectional view of the resultant structure.

The lateral etching process that forms cavities 1402 may be time based. Width variation in spacer 604 may lead to variations in the position of the edges of the recessed nanowires 110. The etching rate in the cavity 1402 depends on the size of the cavity, with narrower orifice corresponding to slower etch rates. Variations in the nanowire size will therefore lead to variations in the depth of cavity 1402.

The variations described above may be reduced by bombarding the exposed ends of nanowire 110 with ions (e.g. silicon ions, germanium ions, and even dopants such as boron which do not amorphize) prior to the formation of the spacer 604 (in FIGS. 5A and 5B). The etching rate of the bombarded portions of nanowires 110 is several times faster than that of the un-exposed portion of nanowire 110 protected by gate material 402. As a result, the cavity 1402 becomes self-aligned with the sidewalls of gate 402 when etched.

If the deposition of spacer 604 is performed at an elevated temperature, the deposition process may anneal the exposed nanowire 110 portions (that have been bombarded with ions) and increase the etching resistance of the exposed nanowire 110 portion. For silicon nanowires 110, the spacer 604 may be formed at a low temperature, for example, less than 500° C. to avoid annealing the bombarded portions of the nanowires 110. If other materials are used to form the nanowires 110 are used, the formation temperature of the spacer 604 may be higher. An alternative that accommodates high temperature deposition of spacer 604 includes performing an ion implantation at an oblique angle to the substrate 100 after the deposition of the spacer 604 with an ion energy that damages the portions of the nanowires 110 that are encapsulated by spacer 604.

Figure 14A:
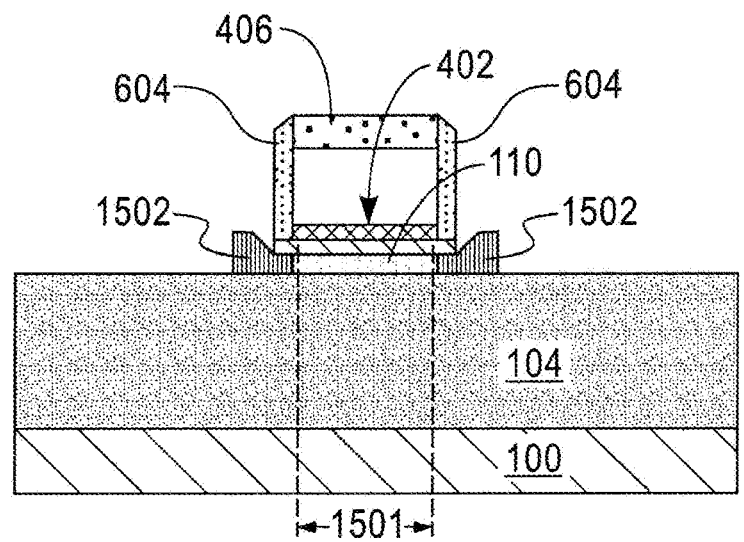
Figure 14B:
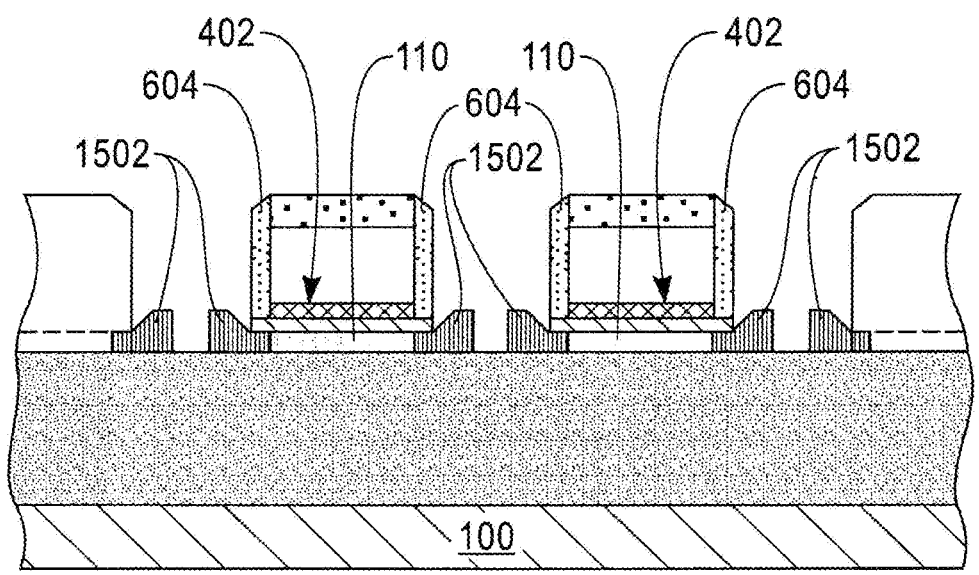

Referring to FIGS. 14A and 14B, a cross-sectional view of the resultant structure having nanowire extensions 1502 that are formed from an in-situ doped epi-silicon growth process similar to the process described above in FIGS. 8A and 8B. The epi silicon growth began in the cavity 1402 (of FIGS. 13A and 13B) from the exposed nanowire 110 in the gate 402 to form the nanowire extensions 1502. Once nanowire extensions 1502 are formed, the doping may be activated by, for example, a laser or flash anneal process. The laser or flash annealing may reduce diffusion of ions into the channel region 1501 of the gate 402, and result in a high uniform concentration of doping in the nanowire extensions 1502 with an abrupt junction in the nanowires 110. Once the ions have been activated, silicidation similar to the process described in FIGS. 12A and 12B above may be performed and capping layers and vias for connectivity (not shown) may be formed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A nanowire field effect transistor (FET) device, comprising:
    a channel region including an elliptically shaped silicon portion disposed on a semiconductor substrate having a first distal end extending from the channel region and a second distal end extending from the channel region, the elliptically shaped silicon portion is partially surrounded by a gate structure disposed circumferentially on the elliptically shaped silicon portion;
    a source region including a first doped epi-silicon nanowire extension contacting the first distal end of the silicon portion, the first doped epi-silicon nanowire extension portion and the first distal end of the elliptically shaped silicon portion defining a first interface that is substantially normal to a plane defined by the semiconductor substrate, the first doped epi-silicon nanowire extension portion and the semiconductor substrate forming a third interface with is substantially coplanar with a fourth interface between the elliptically shaped silicon portion and the semiconductor substrate; and
    a drain region including a second doped epi-silicon nanowire extension contacting the second distal end of the elliptically shaped silicon portion, the second doped epi-silicon nanowire extension portion and the second distal end of the elliptically shaped silicon portion defining a second interface that is substantially normal to a plane defined by the semiconductor substrate, the second doped epi-silicon nanowire extension portion and the semiconductor substrate forming an fifth interface with is substantially coplanar with the fourth interface between the elliptically shaped silicon portion and the semiconductor substrate.

2. The device of claim 1, wherein the first and second doped epi-silicon nanowire extensions are uniformly doped with ions.

3. The device of claim 1, wherein a portion of the first distal end of the elliptically shaped silicon portion is doped with ions diffused from the first doped epi-silicon nanowire extension and a portion of the second distal end of the elliptically shaped silicon portion is doped with ions diffused from the second doped epi-silicon nanowire extension.

4. The device of claim 1, wherein the elliptically shaped silicon portion is cylindrically shaped.

5. The device of claim 1, wherein the first and second doped epi-silicon extensions include an n-type doped material.

6. The device of claim 1, wherein the first and second doped epi-silicon extensions include a p-type doped material.

7. The device of claim 1, wherein the gate structure includes a silicon oxide layer disposed on a channel portion of the nanowire, a dielectric layer disposed on the silicon oxide layer, and a metal layer disposed on the dielectric layer.

8. The device of claim 1, wherein the gate structure defines circumferential layers over a gate portion of the nanowire.

9. The device of claim 1, wherein the first and second doped epi-silicon extensions are uniformly doped.

10. A nanowire field effect transistor (FET) device, comprising:
    a channel region disposed on a semiconductor substrate including a silicon portion having a first distal end and a second distal end, the silicon portion is surrounded by a gate structure disposed circumferentially on the silicon portion;
    a first cavity defined by the first distal end of the silicon portion, the semiconductor substrate, and a portion of the gate structure;
    a second cavity defined by the second distal end of the silicon portion, the semiconductor substrate, and another portion of the gate structure;
    a source region including a first doped epi-silicon nanowire extension, substantially filling and epitaxially extending from the first distal end of the silicon portion in the first cavity, the first doped epi-silicon nanowire extension portion and the first distal end of the silicon portion defining a first interface, wherein the first doped epi-silicon nanowire extension portion has a first thickness proximate to the first interface, and a second thickness at a distal end of the first doped epi-silicon nanowire extension portion, the second thickness is greater than the first thickness, wherein the first doped epi-silicon nanowire extension portion and the semiconductor substrate forming a second interface with is substantially coplanar with a third interface between the elliptically shaped silicon portion and the semiconductor substrate; and
    a drain region including a second doped epi-silicon nanowire extension, substantially filling and epitaxially extending from the second distal end of the silicon portion in the second cavity.

11. The device of claim 10, wherein a portion of the first distal end of the silicon portion is doped with ions diffused from the first doped epi-silicon nanowire extension and a portion of the second distal end of the silicon portion is doped with ions diffused from the second doped epi-silicon nanowire extension.

12. The device of claim 10, wherein the silicon portion is elliptically shaped.

13. The device of claim 10, wherein the silicon portion is cylindrically shaped.

14. The device of claim 10, wherein the first and second doped epi-silicon extensions include an n-type doped material.

15. The device of claim 10, wherein the first and second doped epi-silicon extensions include a p-type doped material.

16. The device of claim 10, wherein the gate structure includes a silicon oxide layer disposed on a channel portion of the nanowire, a dielectric layer disposed on the silicon oxide layer, and a metal layer disposed on the dielectric layer.

17. The device of claim 10, wherein the gate structure defines circumferential layers over the gate portion of the nanowire.

18. The device of claim 10, wherein the first and second doped epi-silicon extensions are uniformly doped.

\* \* \* \* \*